United States Patent [19]

Tomita et al.

[11] Patent Number: 4,570,098
[45] Date of Patent: Feb. 11, 1986

[54] TEMPERATURE COMPENSATED STACK OF PIEZOELECTRIC ELEMENTS

[75] Inventors: Masahiro Tomita, Anjo; Eturo Yasuda, Okazaki, both of Japan

[73] Assignee: Nippon Soken, Inc., Nishio, Japan

[21] Appl. No.: 621,624

[22] Filed: Jun. 18, 1984

[30] Foreign Application Priority Data

Jun. 20, 1983 [JP] Japan .................. 58-109244

[51] Int. Cl.$^4$ ........................... H01L 41/08
[52] U.S. Cl. .................. 310/346; 239/584; 310/323; 310/328; 310/363
[58] Field of Search ............... 310/328, 323, 321, 334, 310/346, 366, 363; 239/584, 585

[56] References Cited

U.S. PATENT DOCUMENTS

| | | | |
|---|---|---|---|
| 1,939,302 | 12/1933 | Heaney | 310/328 X |
| 2,453,595 | 11/1948 | Rosenthal | 310/328 X |
| 3,390,287 | 6/1968 | Sonderegger | 310/346 X |
| 3,437,849 | 4/1969 | Treatch et al. | 310/346 X |
| 3,495,102 | 2/1970 | List et al. | 310/346 X |
| 3,634,787 | 1/1972 | Newell | 310/346 X |
| 3,673,442 | 6/1972 | Sonderegger | 310/346 X |
| 3,673,443 | 6/1972 | Siegel | 310/346 X |
| 3,854,060 | 12/1974 | Cook | 310/363 |
| 4,456,850 | 6/1984 | Inoue et al. | 310/346 X |
| 4,471,256 | 9/1984 | Igashira et al. | 310/328 |

Primary Examiner—Mark O. Budd
Attorney, Agent, or Firm—Cushman, Darby & Cushman

[57] ABSTRACT

A piezoelectric transducer comprising a lamination of piezoelectric elements including one or more elements in which the distortion has a positive temperature dependency and one or more elements in which the distortion has a negative temperature dependency. By selecting the ratio of the number of the piezoelectric elements having the positive and negative temperature dependencies, the temperature dependency of the distortion of a transducer can be eliminated. An actuator for injecting fuel into an automobile at a high speed and delicate response to external operation is provided.

21 Claims, 8 Drawing Figures

Fig. 3(a)  Fig. 3(b)  Fig. 3(c)
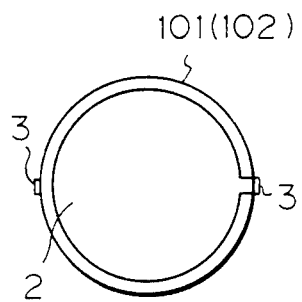
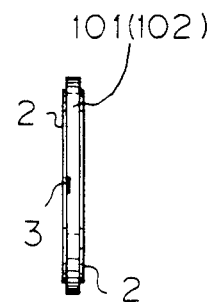
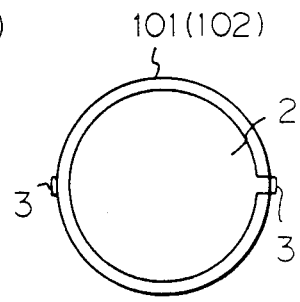
Fig. 4
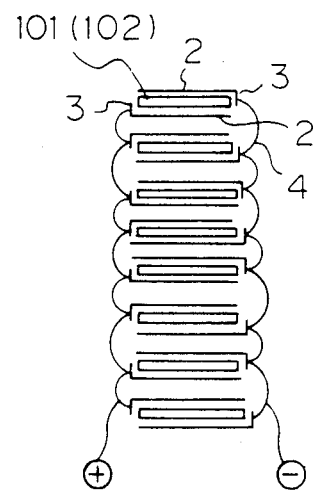

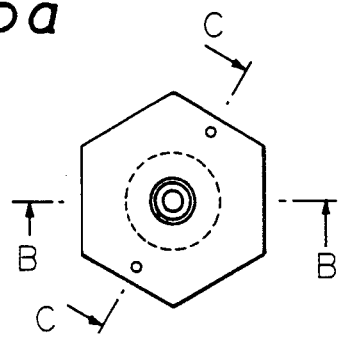
Fig. 5a
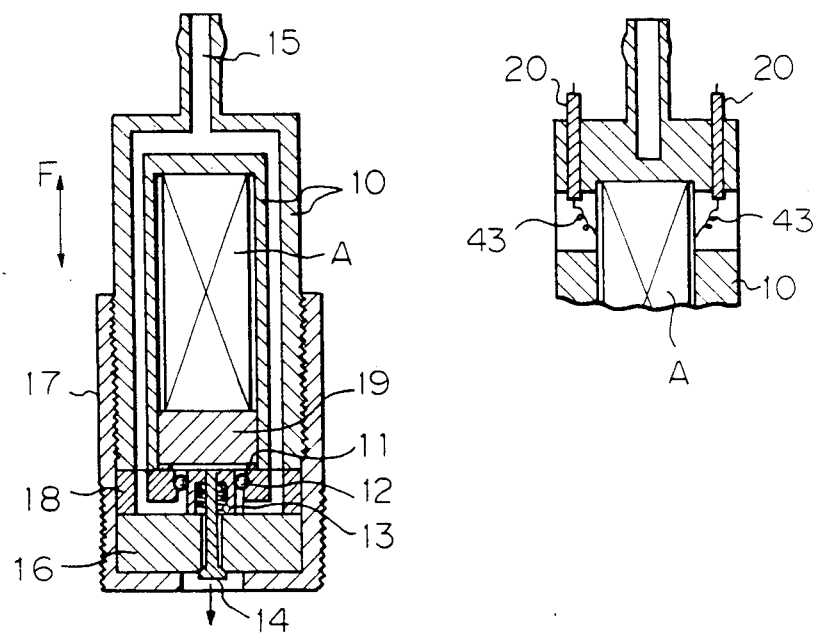
Fig. 5b
Fig. 5c

TEMPERATURE COMPENSATED STACK OF PIEZOELECTRIC ELEMENTS

BACKGROUND OF THE INVENTION

1. Field of the Invention

The present invention relates to a piezoelectric transducer, more specifically to a piezoelectric transducer wherein the distortion i.e., output, does not depend upon a temperature and which can be used in an actuator for injecting fuel such as light oil into an automobile.

2. Description of the Prior Art

The piezoelectric effect in which the shape of a substance is proportionally changed when voltage is applied is well known and its applications include mechanical measurement, recording of sound, and the like. The inventors have no knowledge of a piezoelectric element being used for driving an actuator for injecting fuel into an automobile. Conventionally, an actuator for injecting fuel into an automobile, such as light oil or gasoline, is hydraulically or electromagnetically driven. However, the response for such actuators is relatively slow and harsh.

SUMMARY OF THE INVENTION

An object of the present invention is to provide an actuator which rapidly and delicately responds to external operation which can be used to inject fuel into an automobile.

Another object of the present invention is to provide a piezoelectric transducer comprising a lamination of piezoelectric elements and having substantially no temperature dependency.

These and other objects, features, and advantages of the present invention are accomplished by a piezoelectric transducer comprising a lamination of piezoelectric elements consisting of an assembly of one or more elements in which the distortion has a positive temperature dependency during the application of a voltage and one or more elements in which the distortion has a negative temperature dependency, the elements being provided with electrodes.

The inventors first attempted to fabricate an actuator by laminating ceramic piezoelectric elements in such a manner as to attain a large distortion in a piezoelectric transducer. In such actuators, however, the distortions of the laminations of the piezoelectric elements and the amount of fuel injected were decreased in accordance with rises in the temperature. Therefore, the inventors investigated piezoelectric elements through changing the composition of the piezoelectric element, in order to obtain a lamination of the piezoelectric elements in which the distortion does not depend on the temperature when voltage is applied, but found that the distortion of all piezoelectric elements does depend on the temperature to a large extent. The inventors also found that there are two kinds of temperature dependencies of the distortion of piezoelectric elements, one in which the distortion decreases in accordance with the rise in the temperature, and another in which the distortion increases in accordance with the rise in the temperature, the ratio of the decrease or increase of the distortion being approximately constant. The present invention was made on the basis of these findings by the inventors.

The present invention provides a piezoelectric transducer comprising a lamination of piezoelectric elements in which the distortion does not depend upon the temperature, and an actuator using such a piezoelectric transducer as a drive means.

BRIEF DESCRIPTION OF THE DRAWINGS

The present invention is described below with reference to the drawings in which:

FIG. 3 illustrates front, right side, left side, and back views of a piezoelectric element provided with electrodes;

FIG. 4 is an electrical wiring diagram of a piezoelectric transducer according to the present invention;

FIG. 5a, 5b, and 5c are a plan and two vertical sectional views of an actuator according to the present invention.

DESCRIPTION OF THE PREFERRED EMBODIMENTS

Ceramic piezoelectric elements are produced, by using preparations such as $PbTiO_3$, $PbZrO_3$ etc., or sources for these preparations such as $PbO$, $TiO_2$, $ZrO_2$ etc. These are mixed in a predetermined composition, calcined at approximately 800° C. to 900° C. for 1 hour to 5 hours, shaped into plates or bars by sheeting or pressing, fired at 1150° C. to 1250° C. for 1 hour to 5 hours, and then ground or sliced to form piezoelectric elements. Electrodes are provided to the piezoelectric elements which are then adhered to each other to form a lamination, and wiring is then carried out on the lamination of the piezoelectric elements.

Figure 1:
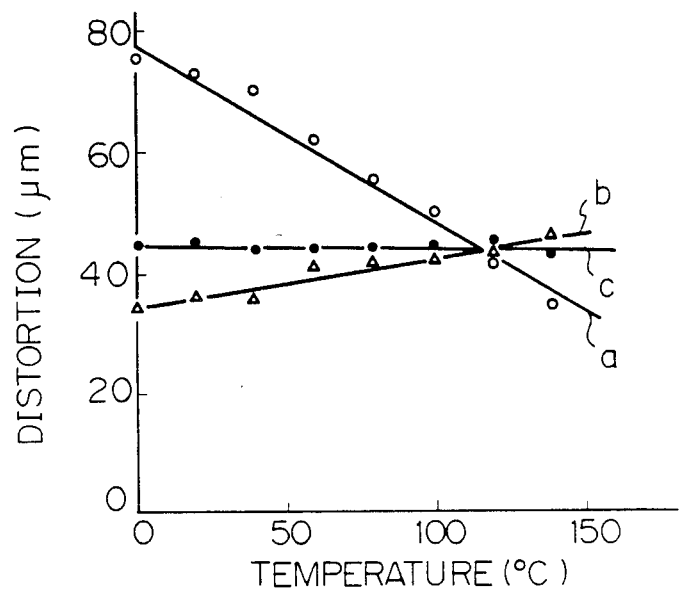
FIG. 1 is a graph showing the distortions of a lamination of piezoelectric elements in relation to temperature.

FIG. 1 shows the distortions of the resultant lamination of the piezoelectric elements when a predetermined voltage is applied at various temperatures. The straight line (a) shows the characteristic line of a lamination of piezoelectric elements of an $x\ Pb(Ni_{1/3}Nb_{2/3})O_3 - y\ PbTiO_3 - z\ PbZrO_3$ systems, wherein $x+y+z=1$, in which the distortion of the lamination of the piezoelectric elements is decreased in accordance with the rise in the temperature. The straight line (b) shows the characteristic line of a lamination of piezoelectric elements of a $[x\ PbTiO_3 - y\ PbZrO_3] + \alpha Nb_2O_3$ system, wherein $x+y=1$, and $\alpha$ is the weight ratio of $Nb_2O_3$ to $[x\ PbTiO_3 - y\ PbZrO_3]$, in which the distortion of the lamination of the piezoelectric elements is increased in accordance with the rise in the temperature.

Figure 2:
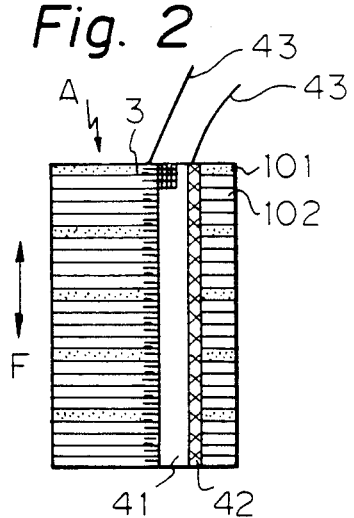
FIG. 2 is a side view of a piezoelectric transducer according to the present invention.

FIG. 2 illustrates a piezoelectric transducer A according to the present invention. The transducer A comprises the lamination of the piezoelectric elements produced as described above. The piezoelectric transducer A comprises a lamination of a plurality of ceramic piezoelectric elements 101 and 102 having the shape of a disc approximately 15 mm in diameter and approximately 0.5 mm in thickness, and forming a cylinder having a height of approximately 40 mm. In the figure, the piezoelectric elements 101 (shown as dotted regions) are made of a composition corresponding to the straight line (a) in FIG. 1, and the piezoelectric elements 102 (shown as blank regions) are made of a composition corresponding to the straight line (b) in FIG. 1. The number of the piezoelectric elements 101 and 102 used is selected in a ratio approximately equal to the ratio of the reciprocal numbers of the absolute values of the inclinations of the straight lines (a) and (b) in FIG. 1.

That is, in FIG. 1, as the inclinations of the straight lines (a) and (b) are −43/150 and 11/150 respectively, the ratio of the reciprocal numbers of the absolute values of the inclinations is 150/43:150/11≈1:4. Therefore, a ratio of one piezoelectric element 101 to four piezoelectric elements 102 is used. Preferably, the piezoelectric elements 101 should be uniformly distributed in the lamination of the piezoelectric elements 101 and 102.

Assembling the piezoelectric elements 101 and 102 is carried out as described in the following. FIG. 3 illustrates a piezoelectric element 101 or 102 provided with electrodes in the form of silver paste. In a piezoelectric element 101 or 102, the two main electrodes 2 are formed by coating a circular-shaped silver paste approximately 13 mm diameter on both main surfaces of the elements 101 or 102, and the two side electrodes 3 are formed by extending the silver paste from the main electrode 2 to a portion of the peripheral side of the disc-shaped elements 101 or 102. The thickness of the silver paste is approximately 5 to 15 micrometers ($\mu$m). A number of the piezoelectric elements 101 and 102 thus provided with electrodes 2 and 3 are laminated together by the adhesive action of the silver paste to give the body of the lamination. The arrangement of the piezoelectric elements 101 and 102 in the lamination is such that the side electrodes 3 are aligned on every other element 101 or 102 in two rows.

Wiring is carried out on the resultant lamination of the piezoelectric elements 101 and 102 as in the wiring diagram shown in FIG. 4, in which the plurality of piezoelectric elements 101 and 102 are electrically connected in parallel. In practice, referring to FIG. 2, a stainless wire mesh 41 of approximately 100 mesh is used for the wiring, in which warps of the wire mesh 41 are united and connected with the side electrodes 3 by the silver paste. Silver paste or solder is applied in a part 42 of the wire mesh since a large electrical resistance occurs if the warps and wefts of the wire mesh 41 are connected to each other without such a barrier. External leads 43 are connected to this portion 42 of the wire mesh. This type of wiring prevents disconnection of the leads 4 from the side electrodes 3 and the formation of cracks in the ceramic piezoelectric elements 101 and 102 when the piezoelectric transducer A comprising the lamination of the piezoelectric elements 101 and 102 is distorted during operation. The temperature dependency of the distortion of the resultant piezoelectric transducer A according to the present invention was investigated by applying a voltage of 500 volts. The temperature dependency of the distortion of the piezoelectric transducer A was approximately zero, as shown by the straight line (c) in FIG. 1.

FIGS. 5a, 5b, and 5c illustrate an actuator according to the present invention, in which the actuator uses the above-fabricated piezoelectric transducer A as a drive means. FIGS. 5b and 5c are sectional views taken along the lines B—B and C—C in FIG. 5a, respectively. The piezoelectric transducer A is contained in a resin case 10. An oil-resistant O-ring 11 prevents fuel passing through a space between the case 10 and a resin push-plate 19. A nonreturn value 12 ensures that the fuel flows in only one direction. A spring 13 forces a nozzle plunger 14 into close contact with a nozzle holder 16. An attaching cover 17 is screwed to the case 10. The case 10, the nozzle holder 16, and a case seating 18 are fixed by knock pins etc., to ensure that there is no change in their relative positions. Fuel such as gasoline, light oil etc., enters through an inlet port 15 into the inside of the case 10 in which a passage extends from the inlet portion 15 to the nonreturn value 12. Referring to FIG. 5c, leads 43 of the piezoelectric transducer A are connected to electrode bars 20 which are connected to an external power source (not shown).

The operation of the actuator using the piezoelectric transducer A is described in the following. Fuel is pumped from a fuel pump through the inlet port 15 into the actuator, passes through the nonreturn valve 12 and fills a chamber defined by the walls of the push-plate 19, the case seating 18, and the nozzle holder 16. At this point, when voltage is applied to the ceramic piezoelectric transducer A through the electrode bars 20, the piezoelectric transducer A expands axially in the direction of the arrow F shown in FIGS. 2 and 5b. As the upper portion of the piezoelectric transducer A is fixed by the case 10, the distortion of the piezoelectric transducer A expands downward, decreasing the volumetric area of the chamber between the push-plate 19 and the case seating 18, resulting in a sudden increase in the pressure of the fuel in the chamber, forcing the nozzle plunger 14 to move downward and forming a gap between the nozzle plunger 14 and the nozzle holder 16 through which the fuel is ejected from the actuator. As the fuel is discharged, the pressure of the fuel is decreased, the nozzle plunger 14 is returned toward the nozzle holder 16 by the action of the spring 13, and the gap between the nozzle plunger 14 and the nozzle holder 16 is closed. When the application of the voltage is stopped, the piezoelectric transducer A contracts in an upward direction, decreasing the pressure in the chamber defined by the push-plate 19, the case seating 18, and the nozzle holder 16. This contraction results in the introduction of more fuel into the chamber through the nonreturn valve 12 to replace that formerly ejected from the chamber.

This type of actuator may be used for an injector for injecting gasoline into an automobile engine, and as an injector for a diesel engine etc. The lamination of a plurality of piezoelectric elements 101 and 102 in a piezoelectric transducer A according to the present invention in such that the voltage of approximately 500 V is applied for a piezoelectric element approximately 0.5 mm in thickness. This is because the voltage must be increased and dielectric breakdown of the air may occur if the thickness of the piezoelectric elements 101 and 102 is increased. Therefore, in this embodiment of the present invention, the thickness of a single piezoelectric element 101 or 102 is approximately 0.5 mm and the piezoelectric transducer A has a lamination structure comprising a plurality of such piezoelectric elements 101 and 102.

Figure 6:
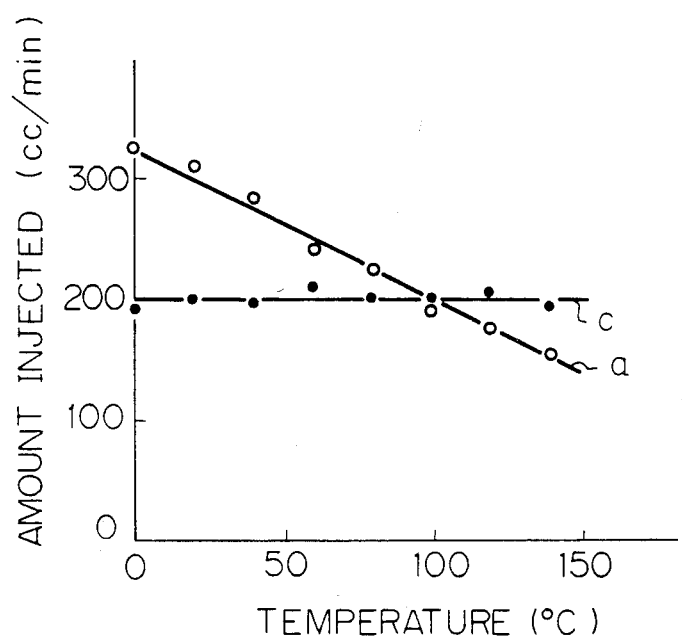
FIG. 6 is a graph showing the amount of light oil injected by an actuator in relation to the temperature.

An experiment was carried out in which the actuator above-fabricated was used for injecting a light oil. A pulse voltage of 200 Hz was applied to the actuator, and the amount of light oil injected was measured under various temperatures. The result is given as the straight line (c) in FIG. 6. The straight line (c) shows almost no temperature dependency in the amount of fuel injected and also a substantial constancy in the amount of fuel injected. Therefore, this actuator, when mounted in an automobile, eliminates unwanted variations in the amount of fuel injected brought about by changes in the ambient temperature and allows easy control of the amount of fuel injected.

A comparative experiment was carried out, in which a piezoelectric transducer similar to the piezoelectric transducer A in the above-mentioned embodiment, except that the laminated piezoelectric elements used are all piezoelectric element 101 having the characteristic of the straight line (a) in FIG. 1, was fabricated and set in an actuator. The amount of light oil injected by this actuator was measured at various temperatures. The results are as shown by the straight line (a) in FIG. 6. The amount of light oil injected decreased in accordance with the rise in the temperature. This decrease occurs because the distortion of the piezoelectric transducer decreases in accordance with a rise in the temperature.

The above-described embodiments of the present invention are only examples. The present invention may be modified, for example, in that the compositions of the piezoelectric elements 101 and 102 may be an x $Pb(Co_{1/3}Nb_{2/8})O_3 - y\ PbTiO_3 - z\ PbZrO_3$ system etc., in which the distortion decreases in accordance with a rise in the temperature, and an x $Pb(Bi_{1/3}Nb_{2/3})O_3 - y\ PbTiO_3 - z\ PbZrO_3$ system etc., in which the distortion increases in accordance with a rise in the temperature. A piezoelectric element may be of a ceramic-resin complex, and the arrangement of the piezoelecteic elements 101 and 102 in the laminations is not limited. However, the uniform arrangement described in the above-mentioned enbodiment is preferable, due to the difference of the heat generated as dielectric loss of the piezoelectric elements. The provision of the electrodes and associated connections is not limited, provided that they allow distortion of the piezoelectric transducer without breakage. Electrodes may be of, e.g., platinum or silver palladium paste. Further, electrodes may be made by, e.g., vapor deposition or electrolytic plating.

We claim:

1. A piezoelectric transducer comprising:
   at least one piezoelectric element of a first type, having a distortion with a positive temperature dependency during application of a voltage thereto;
   at least one piezoelectric element of a second type, having a distortion with a negative temperature dependency during application of a voltage thereto;
   said piezoelectric elements of both said first and second types being arranged and laminated together to provide a laminated composite piezoelectric element means having a distortion which is less dependent on temperature during application of a voltage thereto than are said distortions of said first type of piezoelectric element and than are said distortions of said second type of piezoelectric element; and
   a plurality of electrodes operatively connected with said composite piezoelectric element means and being constructed and arranged for applying a distortion-producing voltage to said composite piezoelectric element.

2. A piezoelectric transducer according to claim 1, wherein the ratio of the number of the piezoelectric elements having the positive temperature dependency and the piezoelectric elements having the negative temperature dependency is approximately equal to the ratio of the reciprocal numbers of the absolute values of the inclinations of the straight line of the distortions of the piezoelectric elements in relation to the temperature.

3. A piezoelectric transducer according to claim 1, wherein the temperature dependency of the distortion of the piezoelectric transducer is substantially zero.

4. A piezoelectric transducer according to claim 1, wherein the piezoelectric elements having the positive and negative temperature dependency are uniformly distributed in the lamination of the piezoelectric elements.

5. A piezoelectric transducer according to claim 1, wherein the piezoelectric elements are of ceramic or a ceramic-resin complex.

6. A piezoelectric transducer according to claim 1, wherein the at least one piezoelectric element having the positive temperature dependency is a $[x\ PbTiO_3 - y\ PbZrO_3] + \alpha Nb_2O_5$ system, wherein $x + y = 1$ and $\alpha$ is a weight ratio of the $Nb_2O_5$ to $(x\ PbTiO_3 - y\ PbZrO_3)$.

7. A piezoelectric transducer according to claim 1, wherein the at least one piezoelectric element having the positive temperature dependency is an x $Pb(Bi_{1/3}Nb_{2/3})O_3 - Y\ PbTiO_3 - z\ PbZrO_3$ system, wherein $x + y + z = 1$.

8. A piezoelectric transducer according to claim 1, wherein the at least one piezoelectric element having the negative temperature dependency is an x $Pb(Ni_{1/3}Nb_{2/3})O_3 - y\ PbTiO_3 - z\ PbZrO_3$ system, wherein $x + y + z = 1$.

9. A piezoelectric transducer according to claim 1, wherein the at least one piezoelectric element having the negative temperature dependency is an x $Pb(Co_{1/3}Nb_{2/3})O_3 - y\ PbTiO_3 - z\ PbZrO_3$ system, wherein $x + y + z = 1$.

10. A piezoelectric transducer according to claim 6, wherein:
    the at least one piezoelectric element having the negative temperature dependency is an x $Pb(Ni_{1/3}NB_{2/3})O_3 - y\ PbTiO_3 - z\ PbZrO_3$ system, wherein $x + y + z = 1$;
    the at least one ratio of the number of piezoelectric elements of the $[x\ PbTiO_3 - y\ PbZrO_3] + \alpha Nb_2O_5$ system to those of the x $Pb(Ni_{1/3}Nb_{2/3})O_3 - y\ PbTiO_3 - z\ PbZrO_3$ system is 1:4.

11. A piezoelectric transducer according to claim 1, wherein each of the piezoelectric elements has the shape of a disc.

12. A piezoelectric transducer according to claim 11, wherein each of the piezoelectric elements has a diameter of approximately 15 mm and a thickness of approximately 0.5 mm.

13. A piezoelectric transducer according to claim 12, wherein the composite piezoelectric elements has the shape of a cylinder.

14. A piezoelectric transducer according to claim 13, wherein the cylinder of the composite piezoelectric element means has a height of approximately 40 mm.

15. A piezoelectric transducer according to claim 11, wherein each of the electrodes comprises a circular main electrode formed on a face of the disc of each piezoelectric element and a side electrode extending from the main electrode to a portion of the peripheral surface of each disc-shaped piezoelectric element.

16. A piezoelectric element according to claim 15, wherein the side electrodes are aligned on alternate said piezoelectric elements in the peripheral surface of the cylinder of the lamination of the piezoelectric elements to form two rows.

17. A piezoelectric element according to claim 1, wherein the electrodes are made from silver paste.

18. A piezoelectric transducer according to claim 1, wherein the electrodes are connected to each other by wire mesh.

19. A piezoelectric transducer according to claim 18, wherein the wire mesh is partially fixed by applying metal paste to the wire mesh.

20. An actuator, comprising:
a piezoelectric transducer including:
at least one piezoelectric element of a first type, having a distortion with a positive temperature dependency during application of a voltage thereto;
at least one piezoelectric element of a second type, having a distortion with a negative temperature dependency during application of a voltage thereto;
said piezoelectric elements of both said first and second types being arranged and laminated together to provide a laminated composite piezoelectric element means having a distortion which is less dependent on temperature during application of a voltage thereto than are said distortions of said first type of piezoelectric element and than are said distortions of said second type of piezoelectric element; and
a plurality of electrodes operatively connected with said composite piezoelectric element means and being constructed and arranged for applying a distortion-producing voltage to said composite piezoelectric element;
wall means defining a chamber having a fluid outlet;
said piezoelectric transducer being effectively communicated to said chamber so that voltage applied to said electrodes, by distortion of said composite piezoelectric element means, may eject fluid from said chamber through said outlet.

21. An actuator, comprising:
a piezoelectric transducer including:
at least one piezoelectric element of a first type, having a distortion with a positive temperature dependency during application of a voltage thereto;
at least one piezoelectric element of a second type, having a distortion with a negative temperature dependency during application of a voltage thereto;
said piezoelectric elements of both said first and second types being arranged and laminated together to provide a laminated composite piezoelectric element means having a distortion which is less dependent on temperature during application of a voltage thereto than are said distortions of said first type of piezoelectric element and than are said distortions of said second type of piezoelectric element; and
a plurality of electrodes operatively connected with said composite piezoelectric element means and being constructed and arranged for applying a distortion-producing voltage to said composite piezoelectric element;
a case containing said piezoelectric transducer as a drive means;
a chamber defined in the case for containing fuel;
an inlet port for fuel connected to the chamber;
a nozzle for ejecting fuel out of the chamber to the outside of the actuator, the nozzle comprising a nozzle holder defining a part of the wall of the chamber and a nozzle plunger engaging the nozzle holder; the nozzle plunger being constructed and arranged to be driven by said piezoelectric transducer so as to form a gap between the nozzle plunger and the nozzle holder to eject fuel therethrough.

* * * * *